United States Patent [19]

Kenney

[11] 4,326,332
[45] Apr. 27, 1982

[54] METHOD OF MAKING A HIGH DENSITY V-MOS MEMORY ARRAY

[75] Inventor: Donald M. Kenney, Shelburne, Vt.

[73] Assignee: International Business Machines Corp., Armonk, N.Y.

[21] Appl. No.: 173,508

[22] Filed: Jul. 28, 1980

[51] Int. Cl.³ .................. H01L 21/265; H01L 21/308
[52] U.S. Cl. .................................... 29/571; 29/576 B; 29/578; 29/580; 148/1.5; 156/647; 156/648; 156/657; 156/659.1; 156/662; 357/55
[58] Field of Search ............ 156/647, 651, 657, 659.1, 156/648, 662; 29/571, 580, 578, 576 B; 357/55; 148/1.5

[56] References Cited

U.S. PATENT DOCUMENTS

| | | |
|---|---|---|
| 103,981 | 12/1979 | Garnache et al. |
| 3,390,025 | 6/1968 | Strieter ............................... 148/187 |
| 3,802,969 | 4/1974 | Marinace ............................ 148/187 |
| 3,904,454 | 9/1975 | Magdo et al. ....................... 156/653 |
| 3,924,265 | 12/1975 | Rodgers ............................... 357/55 |
| 4,003,036 | 1/1977 | Jenne .................................. 357/20 |
| 4,047,975 | 9/1977 | Widmann ............................ 156/647 |
| 4,095,251 | 6/1978 | Dennard et al. ...................... 357/23 |
| 4,116,720 | 9/1978 | Vinson ................................ 148/187 |
| 4,194,283 | 3/1980 | Hoffman .............................. 29/571 |
| 4,272,302 | 6/1981 | Jhaburla .............................. 29/571 |

FOREIGN PATENT DOCUMENTS 55-95366  7/1980  Japan ...................... 357/55

OTHER PUBLICATIONS

Rodgers et al., "VMOS Rom" IEEE Journal of Solid-State Circuit vol. 11 No. 5 (10/76) pp. 614-622.
Rideout et al., "Mosfets . . . Regions" IBM T. J. Watson Research Center, Yorktown Hgs. N. Y.
Presented Internat'l Electron Devices Meeting, Wash. D. C. (12/1976) pp. 593-596.

*Primary Examiner*—Jerome W. Massie
*Attorney, Agent, or Firm*—Howard J. Walter

[57] ABSTRACT

A method for providing high density dynamic memory cells which provides self-alignment of both V-MOSFET device elements and their interconnections through the use of a device-defining masking layer having a plurality of parallel thick and thin regions. Holes are etched in portions of the thin regions with the use of an etch mask defining a plurality of parallel regions aligned perpendicular to the regions in the masking layer. V-MOSFET devices having self-aligned gate electrodes are formed in the holes and device interconnecting lines are formed under the remaining portions of the thin regions. A combination of anisotropic etching and directionally dependent etching, such as reaction ion etching, may be used to extend the depth of V-grooves. A method of eliminating the overhang of a masking layer after anisotropic etching includes the oxidation of the V-groove followed by etching to remove both the grown oxide and the overhang is also disclosed.

10 Claims, 12 Drawing Figures

METHOD OF MAKING A HIGH DENSITY V-MOS MEMORY ARRAY

BACKGROUND OF THE INVENTION

1. Field of the Invention

This invention relates to methods of manufacturing semiconductor devices, and more particularly to methods of manufacturing dynamic memory devices using vertical-metal oxide semiconductor (V-MOS) technology.

2. Description of the Prior Art

In the art of manufacturing semiconductor products the cost of production is inversely related to the number of devices which can be placed on a single semiconductor chip and directly related to the number and complexity of manufacturing process steps necessary to fabricate the product.

Until recently, efforts to increase device component density have been limited by minimum photolithographic dimensions previously achievable in the industry. Recently, however, techniques have become available which enable dimensions of less than one micron to be used in photolithographic processing. Although this enables higher density components to be defined per se, actual component densities can not be substantially increased due to device size requirements dictated by required electrical characteristics. In order to provide further density improvement, interest has recently turned to vertical integration techniques which enable physical devices of predetermined size to utilize less planar surface area of semiconductor chips, thus effectively increasing device density. For example, the article, "Grooves add new dimension to V-MOS structure and performance," by F. B. Jenne, *Electronics*, Aug. 18, 1977, pp. 100–106, discusses some aspects of V-MOS technology and illustrates several techniques for increasing effective device density through the use of V-MOS technology.

Although increases in effective device density through the use of vertically integrated structures helps to reduce the cost of products produced, significant additional cost reduction may also be had by minimizing the number and complexity of manufacturing process steps. This is particularly true when the number of critical mask alignment steps are reduced, since improved density is also provided. Thus, manufacturing processes which include a high number of self-aligning steps, i.e., process steps which do not require the alignment and associated tolerance of photolithographic masks, can directly influence cost of production.

Prior art techniques which use vertical processing techniques in combination with self-aligning masking steps include the following references.

The article, "VMOS ROM," by T. J. Rodgers et al., *IEEE J. Solid State Circuits*, Vol. SC-11, No. 5, Oct. 1976, pp. 614–622, teaches a self-aligning diffusion technique for ensuring the continuity of a diffused device interconnecting line as it passes a V-groove etched MOSFET. An oxide masking layer is used to first define a localized diffusion and then to define the V-groove.

U.S. Pat. No. 4,116,720 to Vinson uses a similar technique to define both a V-groove and an ion-implanted storage node for a dynamic memory cell.

Copending U.S. patent application, "Method for Providing Self-Aligned Conductor in a V-groove Device," R. R. Garnache et al., Ser. No. 103,981, filed Dec. 17, 1979, now U.S. Pat. No. 4,295,924, teaches a method for forming self-aligned electrodes in V-MOS technology.

U.S. Pat. No. 3,924,265 to Rodgers is of interest as it describes several processing alternatives useful in fabricating devices in V-MOS technology.

U.S. Pat. No. 4,003,036 to Jenne describes a single FET/capacitor dynamic memory cell of the type to which the preferred embodiment of the invention described here has been applied.

Additional references related to techniques useful in practicing the subject invention include:

U.S. Pat. No. 4,095,251 to Dennard et al. which relates to single FET/capacitor memory cells including self-aligned gate electrode to word line conductor contacts in which a non-oxidizing protective masking layer such as silicon nitride is used to form a self-aligned contact between a polysilicon electrode and a metal conductor.

U.S. Pat. No. 3,653,898 to Shaw is representative of a number of references which teach the use of intersecting multiple mask images in order to form one or more apertures in a masking layer in order to form various portions of a semiconductor device, and U.S. Pat. No. 3,390,025 to Strieter teaches the use of a similar multiple mask etching technique to make multiple contacts to a single semiconductor device.

SUMMARY OF THE INVENTION

Accordingly, it is an object of this invention to provide increased density of semiconductor devices manufactured in V-MOS technology.

A more specific object is to provide improvements in self-aligned arrays of V-MOS memory devices, particularly dynamic memory cells.

These objects are accomplished through the use of masking techniques which simultaneously define the location of V-MOS devices and their interconnecting conductive elements, which when combined with selective modifications of the prior art relating to self-aligned contacts and electrodes provides a process for substantially self-aligned arrays of single FET/capacitor dynamic memory cells.

These and other objects, features and advantages of the invention will be apparent from the following more particular description of the preferred embodiments of the invention, as illustrated in the accompanying drawings.

DESCRIPTION OF THE PREFERRED EMBODIMENT

Figure 1:
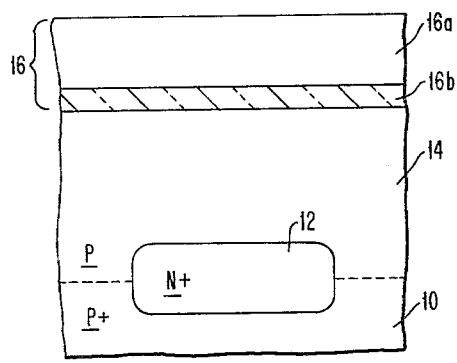
FIGS. 1 through 12 are schematic sectional and plan views of a semiconductor substrate at various stages of processing in accordance with the invention to provide an array of single FET/capacitor dynamic memory cells.
Figure 2:
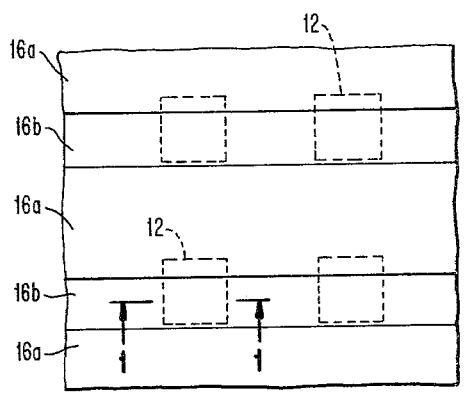

Referring to FIGS. 1 and 2 there is shown a partially processed V-MOS memory device, generally as taught in U.S. Pat. No. 4,003,036 to Jenne, in which there is provided a P+ type semiconductor substrate 10, of for example silicon, including buried N+ regions 12 and P type epitaxial layer 14. Buried region 12 will eventually act as a charge storage node for the single FET/capacitor memory cell to be formed in the substrate. Those skilled in the art will recognize that many equivalent techniques may be used to form this initial sub-surface configuration and that epitaxial layer 14 may include gradations of p-type impurity concentration in order to control the capacitive characteristics of buried region 12 and/or to control the conduction characteristics of the V-MOSFET to be subsequently formed in the substrate. The thickness of epitaxial layer 14 is a design parameter dependent upon various circuit and process considerations as well as the geometrical shape of the V-etched groove, as discussed more extensively below. As is also well known, the substrate should be provided having the top surface oriented parallel to the 100 plane of the semiconductor crystal structure in order to obtain the desired V-shape by anisotropic etching.

After formation of the epitaxial layer 14, or its equivalent, an insulating masking layer 16 is provided, preferably by thermally oxidizing and etching the top surface of layer 14, to a thickness of several thousand angstroms. Layer 16 is formed by a multiple step process, in a manner similar to that described in U.S. Pat. No. 3,653,898, as follows. A first thermal oxide of about 2000–4000 angstroms is uniformly grown. Then using standard photolithographic techniques parallel strips are etched across the memory array area of the semiconductor wafer of which substrate portion 10 and epitaxial layer 14 are a part. The width and spacing of the etched strips is dependent on the pitch or spacing of the buried N+ regions 12, as these strips define two of the four sides of the subsequently etched V-groove. Positioning of the mask used to define the strips is not critical as it is only necessary that the center of the strips be positioned directly over at least some portion of the buried regions 12 such that when the V-etching is performed the etched V-groove or pit intersects a buried region. Etching of the initially uniform layer 16 may be performed by either of two alternative techniques. In a first and preferred technique the entire thickness of layer 16 is removed to expose expitaxial layer 14 and a new thinner oxide layer 16b is regrown to a thickness of about one-tenth to one-half of that of the original layer. This results in a dual thickness masking layer having thin regions 16b and thicker regions 16a. Instead of using thermal oxidation to provide thinner portion 16b a blanket chemical vapor deposition process can be used, in which case a somewhat thinner initial layer can be provided. The second alternative to forming layers 16a and 16b is to only partially etch through the thickness of the initial uniform layer 16. This alternative is somewhat more difficult to control but may be used if the number of processing steps are required to be minimized. In view of processing steps to follow, it is preferred that the final thickness of portion 16a of layer 16 be greater than that required to act as both a device isolating field dielectric and as an ion implantation blocking mask. Portion 16b on the other hand is preferred to be thick enough to act as an etch mask and thin enough to act as a screen oxide for ion implantation.

Figure 3:
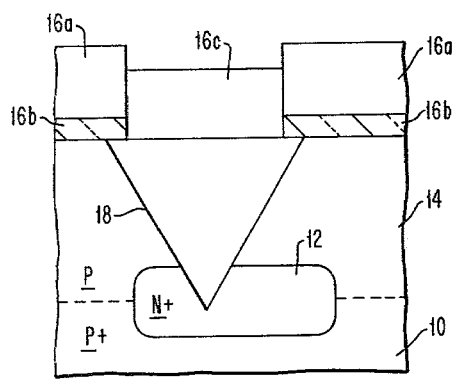
Figure 4:
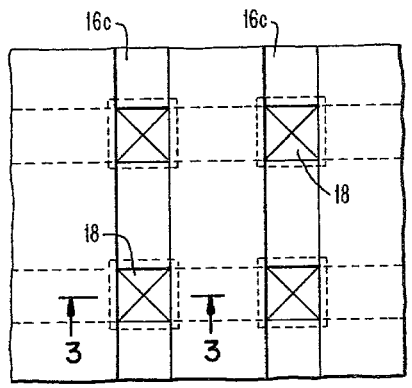

Following the definition of regions 16a and 16b in masking layer 16, a second set of parallel strip-like regions are formed substantially perpendicular to portions 16b, as illustrated in FIGS. 3 and 4. The purpose of the second set of parallel strips is to define the remaining two sides of the V-groove by enabling portion 16b to be completely removed at the sites of intended V-MOS devices while only partially removing the thickness of portions 16a. The positioning of the photomask defining the second set of strips is also non-critical for the same reasons given above with respect to the mask for the initial set of strips. Following the etching of the second set of strips a partially thinned portion 16c remains in layer 16. This completes the fabrication substantially square apertures in masking layer 16.

After providing the multilevel masking layer 16, an anisotropic etchant such as a hydrazine-water solution is used to etch self-terminating recesses or V-shaped pits 18 in the substrate. Provided that substrate 10 and epitaxial layer 14 have the preferred 100 orientation, anisotropic etching will provide pyramidal-shaped etch pits limited at their sidewalls by 111 crystal planes. Reference to the article, "Optimization of Hydrazine-Water Solution for Anisotropic Etching of Silicon in Integrated Circuit Technology," M. J. Declercq et al., *J. Electro-Chem. Soc.*, April 1975, pages 545–552, will provide more detailed information on anisotropic etching of silicon. Since the dimensions of etch pit 18 are defined according to the crystal structure of the substrate, the thickness of epitaxial layer 14 and the maximum width of the pit 18 will have a predetermined relationship to each other.

However, an alternative etching technique which enables the thickness of epitaxial layer 14 to be varied or enables smaller spacing between adjacent etch pits, and thus higher density of devices, may be implemented. If either, or both, of these conditions are desirable from a design view point, following the formation of the self-terminating etching of the etch pit, which in the case of a thicker epitaxial layer or a narrower opening in mask layer 16 will result in an etch pit reaching only partially through epitaxial layer 14, an orientation independent process, such as reaction ion etching may be used to deepen the etch pit while maintaining the pyramidal-shaped configuration in the lower portion of the etched region.

Following the etching of etch pit 18 an overhanging portion of masking layer 16 will remain which partially blocks the opening of the etch pit and can cause discontinuities and/or voids in later applied layers used to fabricate MOSFET, or other, devices. In order to remove this undesirable overhang either of two techniques may be used. The first is to expose the semiconductor device to a dip etch which is selective to the material of masking layer 16 such that half the thickness of layer 16, here that of portion 16b, is removed. The etchant will attack both the top and bottom of the overhang equally thus eliminating it entirely while leaving one-half the thickness of layer 16 on the substrate. This technique results in substantial etching of the masking layer 16 at the edges of the etch pits and exposes a lateral shelf of epitaxial layer 14 of about 3000 to 4000 angstroms when using a planar masking layer of about 5000 angstroms thickness.

Figure 5:
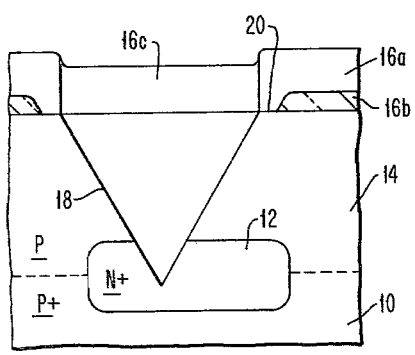
Figure 6:
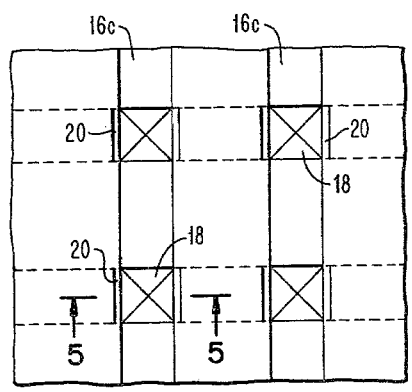

An alternative technique which results in a much smaller laterally exposed surface can be implemented as follows. After completing the etching of the etch pits the substrate is exposed to an oxidizing atmosphere in order to thermally grow a thermal oxide on the 111 walls of the etch pit to a thickness of about one-half that of masking layer 16. In the device of the subject invention about one-half the thickness of layer 16b should be grown. This is followed by a dip etch step adequate, as above, to remove one-half of the original thickness of portion 16b. The fact that the overhanging portion of layer 16b does not increase during oxidation and the presence of an oxide layer on the 111 walls of the etch pit results in significantly less laterally exposed region 20 on the top of epitaxial layer 14. The result of this step is illustrated in FIGS. 5 and 6.

Figure 7:
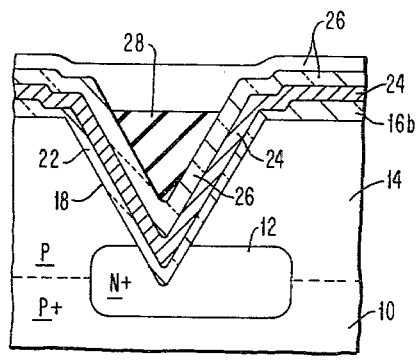

Next, referring to FIG. 7, a thin dielectric layer 22 is provided within the etch pit to act as the gate dielectric. It is preferred to use a thermal oxidation process to provide about 500 angstroms of silicon dioxide as layer 22. Following the growth of layer 22, a blanket deposition of a layer of conductive gate electrode material 24, such as doped polysilicon or other oxidizable conductor is provided followed by an oxidation resistant material layer 26 such as silicon nitride. It may be preferrable to provide a thin layer of silicon dioxide between layers 24 and 26 and to provide an additional oxide layer on top of layer 26 as is commonly practiced in the prior art in order to facilatate the etching and subsequent removal of layer 26. See U.S. Pat. No. 4,095,251 for further details of such practices.

In accordance with the teaching in U.S. Pat. No. 4,295,924 to R. R. Garnache et al., a self-aligned photoresist mask 28 is formed only in the regions of layers 22–26 formed within the etch pits. Briefly, this process includes the steps of depositing a layer of masking material over the substrate which completely fills the etch pits 18 and provides a planar upper surface. A directional etching technique having an etch rate suitable for easy control of etch depth is used to uniformly remove the top portion of the masking layer until a self-aligned plug 28 of masking material remains only within the recesses of the etch pits. The amount of masking material retained should be approximately equal to that thickness required to leave the upper surface of plug 18 at about or slightly below the upper surface of epitaxial layer 14.

Figure 8:
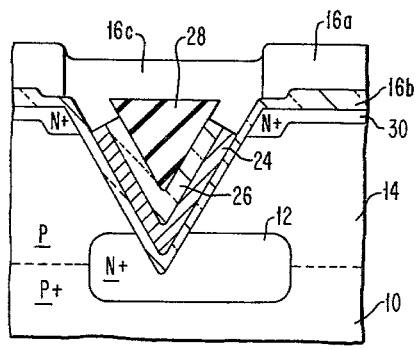

Following the formation of self-aligned mask 28, silicon nitride layer 26 and polysilicon layer 24 are etched sequentially leaving only those portions protected to photoresist plug 28, as shown in FIG. 8.

Figure 9:
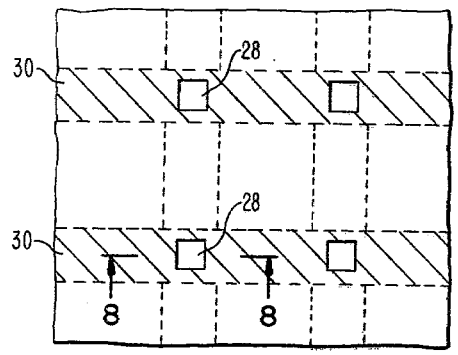

Next, an n-type impurity ion suitable for forming source/drain regions in a MOSFET are ion implanted through portion 16b of layer 16 to form the conductive device interconnecting bit or data lines of the memory array. No mask is required for this step as portions 16a and 16c of oxide layer 16 are thick enough to prevent penetration of ions to the semiconductor surface. Depending upon the material and thickness of gate electrode layer 24, photoresist plug 28 may or may not be retained to act as a further mask to the implanted ions over the channel region of the device. Shading lines in FIG. 9 show the areas of the substrate which are implanted. Ion implanted regions 30 act as source/drain regions of the MOSFET device being formed and also provide low resistance interconnection between adjacent devices in the array.

Figure 10:
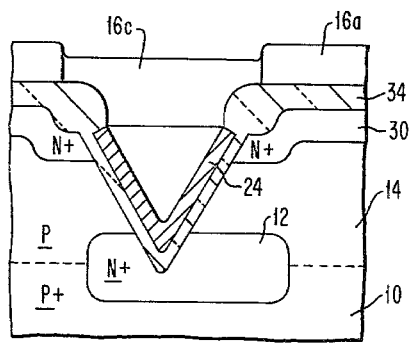

Following the ion implantation step the substrate is subjected to a thermal oxidation drive-in process in order to grow about 4000 angstroms of silicon dioxide 34 over the implanted regions as shown in FIG. 10. The silicon nitride layer 26, not shown in FIG. 10, acts as an anti-oxidation mask for the polysilicon gate electrode layer 24 during the oxidation drive-in process. Following the formation of oxide 34 the silicon nitride layer is removed by etching to expose the top of polysilicon layer 24 which is now entirely surrounded by dielectric material.

Figure 11:
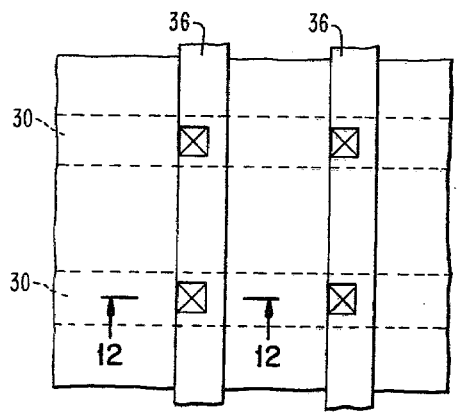
Figure 12:
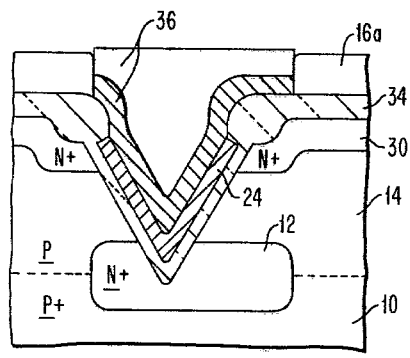

Finally, as shown in FIGS. 11 and 12 conductive interconnection electrodes 36 are formed either by a subtractive etching process or by a lift-off technique to interconnect the gate electrodes 24 of devices in a direction perpendicular to the n-type bit lines 30. The material used for electrodes 36 may be aluminum if no additional high temperature processes are to follow in the process or they may be doped polysilicon or other material suitable for use in high temperature processing. Each self-aligned, gate electrode to interconnection metallurgy contact is shown as a box containing a cross in FIG. 11. As with the previous masks used in this process the positioning of the mask used to form electrodes 36 is not critical as long as contact between layers 24 and 36 is assured. FIG. 12 shows the completed V-MOSFET single FET/capacitor memory cell.

Although only the array portion of an integrated circuit memory device has been described, those skilled in the art will recognize that additional planar or V-MOS devices can also be fabricated simultaneously for use in support circuit of the memory on the same semiconductor substrate. And while only four photolithographic masks are described, it may be desirable to use additional masks, either prior to, during or subsequent to the process sequence described in order to fabricate additional devices and/or to provide different functions for the material layers used in this process. For example polysilicon layer 24 may also be used as a conductive interconnection layer outside of the array area by providing separate photoresist masking for the definition of portions of layer 24. Buried contacts between layer 24 and epitaxial layer 14 may be achieved by a separate masking and etching step prior to deposition of layer 24.

The process described is capable of providing memory arrays in which only four masking steps are required, none of which require critical alignment. High density is achieved by the use of V-MOS structures in combination with a series of self-aligning process steps. Higher product yields are obtainable because of the small number of process steps.

While the invention has been described with respect to a preferred embodiment, those skilled in the art will appreciate that substitution of equivalent materials and/or process steps are possible within the scope of the invention.

What is claimed is:

1. The method of making a matrix of interconnected self-aligned semiconductor devices on the surface of a semiconductor substrate comprising the steps of:
   providing an first masking layer on the surface on the surface of a semiconudctor substrate of a first conductivity type, said masking layer having a first plurality of parallel spaced first regions of a first thickness separated by a second plurality of regions of a second thickness greater than said first thickness;
   selectively removing a plurality of parallel strip-like regions of said masking layer in a pattern oriented substantially perpendicular to said first regions to expose the surface of said substrate only under those areas of said masking layer common to said first regions and said strip-like regions;
   forming a plurality of self-aligned V-MOS semiconductor devices in said exposed areas of said substrate, each of said devices including a gate electrode layer, and then
   forming self-aligned conductive means in said substrate to interconnect said MOS semiconductor devices, said conductive means being defined by said first regions in said masking layer and by said gate electrode layers.

2. The method of claim 1 wherein the forming of said semiconductor devices includes the steps of selectively removing at least a portion of the thickness of said substrate in said exposed areas to form recesses in said substrate followed by the formation of said semiconductor devices in said recesses.

3. The method of claim 2 wherein said recesses are pyramidal-shaped and said semiconductor devices are VMOSFET devices.

4. The method of claim 1 wherein said semiconductor substrate includes a plurality of previously formed buried regions of a second conductivity type which are positioned in a matrix pattern substantially aligned with the pattern of exposed areas of said substrate to be formed.

5. The method of claim 4 wherein said semiconductor are VMOSFET devices each associated with one of said buried regions in order to form a single FET/capacitor dynamic memory cell.

6. The method of claim 5 wherein said conductive means interconnecting said semiconductor devices are formed by ion implanting an opposite type impurity region through said first regions in said masking layer.

7. The method of claim 1 wherein the step of forming a plurality of MOS semiconductor devices includes the steps of:

anisotropically etching a recess in the surface of said substrate as defined by said exposed areas;

exposing said etched substrate to an oxidizing atmosphere for a period of time sufficient to grow a thermal oxide on the surfaces of said recess to a thickness substantially equal to one-half the thickness of said first regions of said masking layer; and exposing said oxidized substrate to an etching environment for a period of time sufficient to selectively remove a thickness of thermal oxide equal to about one-half the thickness of said first regions of said masking layer to expose said substrate within said recess and to remove any overhanging portions of said masking layer formed as a result of said anisotropic etching step.

8. The method of claim 7 wherein said substrate comprises a 100 oriented silicon wafer and said anisotropic etching step produces a recess having a pyramidal-shape defined by 111 planes as sidewalls.

9. The method of claim 8 wherein the step of anisotropically etching is followed by the step of:

extending the depth of said recess while maintaining its initial shape in its lower portion by exposing said substrate to a directionally dependent etching medium which etches said substrate in a direction substantially perpendicular to said first surface.

10. The method of claim 9 wherein said substrate includes at least one buried region of a second conductivity type at a predetermined depth, and wherein the depth of said anisotropically etched recess is initially less than said depth and is extended to said depth by said directionally dependent etching medium so that the recess intersects said buried region.

* * * * *